US011257552B2

United States Patent
Liu

(10) Patent No.: US 11,257,552 B2
(45) Date of Patent: Feb. 22, 2022

(54) PROGRAMMING A MEMORY DEVICE

(71) Applicant: Macronix International Co., Ltd., Hsinchu (TW)

(72) Inventor: Yi-Chun Liu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 211 days.

(21) Appl. No.: 16/281,258

(22) Filed: Feb. 21, 2019

(65) Prior Publication Data

US 2020/0273529 A1 Aug. 27, 2020

(51) Int. Cl.
*G11C 16/34* (2006.01)
*G06F 3/06* (2006.01)
*G06F 11/10* (2006.01)
*G11C 29/00* (2006.01)
*G11C 11/56* (2006.01)
*G11C 16/16* (2006.01)
*G11C 16/08* (2006.01)
(Continued)

(52) U.S. Cl.
CPC ........ *G11C 16/3431* (2013.01); *G06F 3/0619* (2013.01); *G06F 3/0679* (2013.01); *G06F 11/1004* (2013.01); *G06F 11/1072* (2013.01); *G11C 11/5635* (2013.01); *G11C 16/08* (2013.01); *G11C 16/16* (2013.01); *G11C 16/24* (2013.01); *G11C 16/349* (2013.01); *G11C 16/3459* (2013.01); *G11C 29/42* (2013.01); *G11C 29/789* (2013.01)

(58) Field of Classification Search
CPC . G11C 16/3431; G06F 3/0619; G06F 3/0679; G06F 11/1004; G06F 11/1072; G06F 11/5635; G06F 16/08; G06F 16/16; G06F 12/00; G06F 13/00
See application file for complete search history.

(56) References Cited

U.S. PATENT DOCUMENTS 10,134,474 B1 * 11/2018 Chen ................... G06F 3/0679
10,140,040 B1 * 11/2018 Koudele .............. G11C 29/021
(Continued)

FOREIGN PATENT DOCUMENTS

| CN | 102150216 A | 8/2011 |
| CN | 104919528 A | 9/2015 |
| CN | 106297881 A | 1/2017 |

OTHER PUBLICATIONS

US 10,163,498 B1, 12/2018, Jean et al. (withdrawn)

*Primary Examiner* — Tuan V Thai
(74) *Attorney, Agent, or Firm* — Fish & Richardson P.C.

(57) ABSTRACT

A memory device includes a memory cell array and a memory controller. The memory cell array includes a plurality of memory blocks. Each of the memory blocks includes a plurality of word lines. A plurality of memory chunks is coupled to at least one of the word lines. The memory controller is configured to program data to a particular memory chunk of the plurality of memory chunks by performing a chunk operation that includes selecting a particular word line from the plurality of word lines, selecting a particular memory chunk from the plurality of memory chunks that are coupled to the particular word line, and applying a program voltage to a particular memory block corresponding to the particular memory chunk to program data to the particular memory chunk.

20 Claims, 9 Drawing Sheets

(51) Int. Cl.
    *G11C 16/24*     (2006.01)
    *G11C 29/42*     (2006.01)

(56) References Cited

U.S. PATENT DOCUMENTS

| | | | |
|---|---|---|---|
| 2015/0270852 A1* | 9/2015 | Kim | G06F 11/1048 |
| | | | 714/764 |
| 2016/0179428 A1* | 6/2016 | Parker | G11C 16/12 |
| | | | 711/103 |
| 2018/0032276 A1 | 2/2018 | Srinivasan et al. | |

* cited by examiner

Cycle T

Cycle T+1

Cycle T

Cycle T+1

PROGRAMMING A MEMORY DEVICE

TECHNICAL FIELD

The present application relates to a memory device. In particular, the present application relates to programming data to memory cells in a memory device.

BACKGROUND

Memory cells can be programmed by applying a set of voltages during a programming cycle. In particular, to program data to a high-density memory device, e.g., a high-density NAND flash memory device or a NOR flash memory device, different levels of voltages can be applied to the high-density memory device at different timings for suitable periods.

SUMMARY

The present application describes techniques to program data to memory cells in a memory device. In particular, where a memory controller programs multi-level data to multiple memory chunks in a memory block, a disturbance can occur between memory chunks. Moreover, where a memory block has a status of wear-out or broken, the memory block is more likely to have the disturbance problem. If there is a disturbance between memory chunks, the memory controller may program data to a particular memory chunk incorrectly. Thus, the disturbance can cause reliability problems in a memory device. In addition, where a memory device requires high reliability, e.g., a memory device is used for communication devices, the disturbance problem should be avoided to guarantee a certain level of reliability.

The techniques disclosed in the present application can reduce or substantially eliminate the disturbance problems occurring in a memory device. In particular, a memory controller obtains data about an error rate of a memory block and determines which programming operations the memory controller performs. For example, where the memory block has a high error rate, the memory controller can perform one-shot programming operations to avoid the disturbance. On the other hand, where the memory block has a low error rate, the memory controller can perform multi-level programming operations to increase the efficiency of the programming operations. As a result, the techniques can improve the reliability of the memory device without compromising the efficiency of the memory device.

In general, one innovative aspect of the subject matter described in this specification can be implemented in a memory device comprising a memory cell array and a memory controller. The memory cell array includes a plurality of memory blocks. Each of the memory blocks includes a plurality of word lines. A plurality of memory chunks is coupled to at least one of the word lines. The memory controller is configured to program data to a particular memory chunk of the plurality of memory chunks by performing a chunk operation that includes selecting a particular word line from the plurality of word lines, selecting a particular memory chunk from the plurality of memory chunks that are coupled to the particular word line, and applying a program voltage to a particular memory block corresponding to the particular memory chunk to program data to the particular memory chunk.

The foregoing and other implementations can each optionally include one or more of the following features, alone or in combination. In particular, one implementation includes all the following features in combination. The memory controller may be configured to select the particular word line from the plurality of word lines sequentially. The memory controller may be configured to select the particular memory chunk from the plurality of memory chunks sequentially. The memory controller may be configured to select the particular word line from the plurality of word lines randomly. The memory controller may be configured to select the particular memory chunk from the plurality of memory chunks randomly. The memory controller may be configured to perform the chunk operation to the particular memory block by providing a program voltage that is between 12 V and 26 V.

The memory device may include an error detection circuit that is configured to detect one or more errors that occur in the particular memory block and generate an error rate. The memory controller may be configured to perform the chunk operation upon the error rate satisfying a threshold value.

The memory device may include a plurality of bit lines, each of the bit lines being respectively coupled to one or more memory chunks of the plurality of memory chunks. The memory controller may be configured to perform the chunk operation to a single memory chunk in a bit line of the bit lines during a single cycle of the chunk operation.

Another innovative aspect of the subject matter described in this specification can be implemented in a memory device comprising a memory cell array, an error detection circuit and a memory controller. The memory cell array includes a plurality of memory blocks. Each of the memory blocks includes a plurality of word lines. A plurality of memory chunks are coupled to at least one of the word lines. The error detection circuit configured to detect one or more errors that occur in the memory block and generate an error rate. The memory controller is configured to program data to a particular memory chunk of the plurality of memory chunks by performing operations that include obtaining, from the error detection circuit, the error rate. When the error rate satisfies a threshold, the memory controller determines a status of a particular memory block. Based on the status of the particular memory block, the memory controller determines which programming operations to perform between a first programming operation and a second programming operation, and performs the determined programming operations to the particular memory block.

The foregoing and other implementations can each optionally include one or more of the following features, alone or in combination. In particular, one implementation includes all the following features in combination. The first programming operation may include selecting a particular word line from the plurality of word lines, selecting a particular memory chunk from the plurality of memory chunks that are coupled to the particular word line, and applying a program voltage to the particular memory block to program data to the particular memory chunk. The second programming operation may include selecting one or more first memory chunks in the particular memory block, applying a first program voltage to the particular memory block to program data to the one or more first memory chunks simultaneously, selecting one or more second memory chunks in the particular memory block, and applying a second program voltage to the particular memory block to program data to the one or more second memory chunks simultaneously.

Another innovative aspect of the subject matter described in this specification can be implemented in a method to program one or more memory cells of a memory device by a memory controller during a programming cycle. The method includes selecting, by the memory controller, a particular word line from a plurality of word lines included in a particular memory block of a plurality of memory blocks in a memory cell array of the memory device, where a plurality of memory chunks is coupled to at least one of the word lines. The memory controller selects a particular memory chunk from the plurality of memory chunks that are coupled to the particular word line. The memory controller applies a program voltage to the particular memory block corresponding to the particular memory chunk to program data to the particular memory chunk.

The foregoing and other implementations can each optionally include one or more of the following features, alone or in combination. In particular, one implementation includes all the following features in combination. Selecting the particular word line may include selecting the particular word line from the plurality of word lines sequentially. Selecting the particular memory chunk may include selecting the particular memory chunk from the plurality of memory chunks sequentially. Selecting the particular word line may include selecting the particular word line from the plurality of word lines randomly. Selecting the particular memory chunk may include selecting the particular memory chunk from the plurality of memory chunks randomly. Applying the program voltage may include providing a program voltage between 12 V and 26 V.

The method may include detecting, using an error detection circuit in the memory device, one or more errors that occur in the particular memory block. In response to detecting the one or more errors, the error detection circuit may generate an error rate. Upon the error rate satisfying a threshold value, the memory controller may apply the program voltage to the particular memory block corresponding to the particular memory chunk to program data to the particular memory chunk.

Selecting a particular memory chunk from the plurality of memory chunks may include selecting a single memory chunk in a bit line of a plurality of bit lines in the memory device during a programming cycle. Each of the plurality of bit lines may be coupled to one or more memory chunks of the plurality of memory chunks.

The details of one or more examples of the subject matter described in this specification are set forth in the accompanying drawings and the description below. Other potential features, aspects, and advantages of the subject matter will become apparent from the description, the drawings, and the claim.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

A memory cell in a memory device can be programmed, e.g., data can be written to, read from, or erased from the memory cell, by applying a suitable voltage to the memory cell at a particular timing for a suitable time period during a programming cycle.

Figure 1:
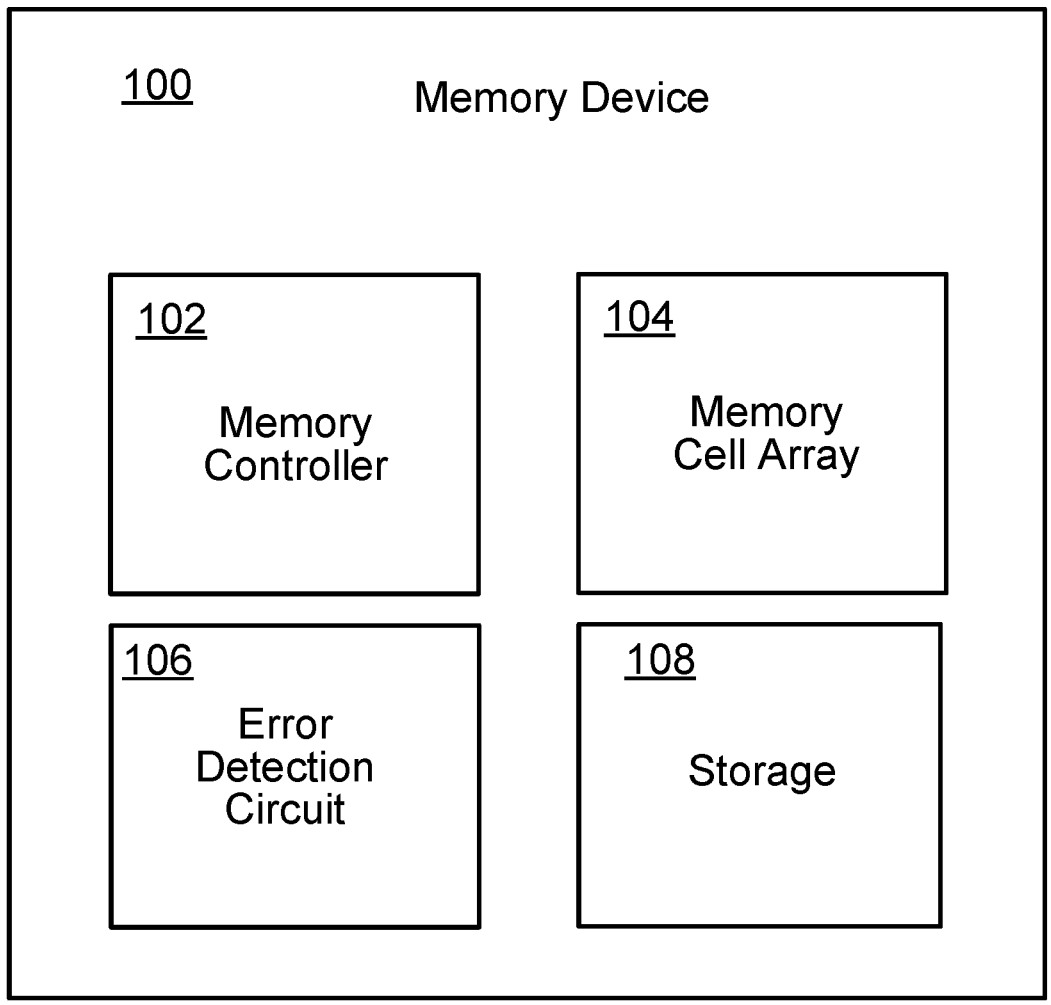
FIG. 1 illustrates an example memory device.

FIG. 1 illustrates an example memory device 100. The memory device 100 includes a memory controller 102 and a memory cell array 104. The memory controller 102 includes hardware and software logic to perform various operations, which include programming the memory cell array 104, e.g., writing to, reading from, or erasing from the memory cell array 104. In some implementations, the memory controller 102 includes one or more processors to program memory cells in the memory cell array 104. For example, the memory controller 102 can perform operations to program the memory cell array 104. The operations can be stored in a storage accessible by the memory controller 102. In some implementations, the operations can be stored at a flash memory or a hard disk. In some implementations, the operations can be stored at a storage, e.g., a storage 108. In some implementations, the operations can be stored in a dedicated portion of the memory cell array 104 that is distinct from the memory cells that are to be programmed.

In some implementations, the memory device 100 does not include the memory controller 102. In these implementations, the memory device 100 can communicate with a device that is external to the memory device 100 and the external device controls various operations performed with respect to the memory cell array 104. For example, the external device can include one or more computers to perform programming operations to the memory cell array 104. In some implementations, control signals can be transferred between the memory device 100 and the external device through suitable input/output ports. In some other implementations, the memory device 100 can include the memory controller 102 and communicate with an external device to perform operations to the memory cell array 104. For example, some operations can be controlled by the memory controller 102 and other operations can be controlled by the external device.

The memory cell array 104 includes one or more memory blocks. In some implementations, each of the memory blocks may include a plurality of word lines. A plurality of memory chunks can be coupled to each word line. A memory chunk can include a plurality of memory cells. In some implementations, a particular number of memory cells are grouped as one memory chunk. For example, one memory chunk can include 16, 32 or 64 memory cells. Memory chunks will be described in greater detail with reference to FIGS. 3A and 3B.

The memory cells in the memory cell array 104 can be single-level cells or multi-level cells. In some implementations, the memory cell array 104 includes nonvolatile memory cells, e.g., a flash memory cells. However, the memory cell array 104 can include any type of memory cells including, but not limited to, 2D NAND flash memory cells, 3D NAND flash memory cells comprising U-shaped strings, 3D NAND flash memory cells comprising non-U-shaped strings, and NOR flash memory cells.

The memory device 100 further includes an error detection circuit 106. The error detection circuit 106 separately detect errors for each particular memory block in the memory cell array 104. For example, the error detection circuit 106 can be an error bit count (EBC) circuit that counts a number of errors occurring in a particular memory block for a particular time period. The counted number of errors can be reported to the memory controller 102 such that the memory controller 102 can determine a status of the memory block based on the numbers of errors. For example, where the counted number of errors does not satisfy, e.g., is less than, a first threshold, the memory controller 102 can determine that a status of the memory block is good. As another example, where the counted number of errors satisfies, e.g., is more than, the first threshold, but does not satisfy, e.g., is less than, a second threshold, the memory controller 102 can determine that a status of the memory block is wear-out. As another example, where the counted number of errors satisfies, e.g., is more than, the second threshold, the memory controller 102 can determine that a status of the memory block is broken. Rather reporting a counted number of errors, the error detection circuit 106 can report an error rate, e.g., a number of errors per unit time, for a memory block. The controller 102 can compare the error rate to a threshold error rate to determine the status of the memory block.

In some implementations, the memory controller 102 can perform different programming operations based on a status of a cell. For example, where a status of a cell is good, the memory controller 102 can perform multi-level programming operations to the memory block. As another example, where a status of a cell is wear-out or broken, the memory controller 102 can perform one-shot programming operations to the memory block instead of the multi-level programming operations.

In some implementations, even where a status of a cell is good, the memory controller 102 can perform one-shot programming operations to the memory block. For example, where the memory device 100 needs high reliability, the memory controller 102 can perform one-shot programming operations to the memory block instead of the multi-level programming operations. The multi-level programming operations and the one-shot programming operations will be described in greater detail below with reference to FIGS. 7A and 7B.

In some implementations, the memory device 100 can further include a storage 108 to store information for programming memory cells in the memory cell array 104. For example, the information can include voltage data to perform programming operations, timing data to define one or more time periods during which particular voltage levels are applied to the memory cell array 104. A variety of formats are possible for the timing data for the different voltage levels are applied to the memory cell array, e.g., a start timing and an end timing for a particular voltage level, or a start timing and a durations for the particular voltage level. The storage 108 can be any type of suitable storage. For example, the storage 108 can be static random access memory (SRAM), NAND flash memory, or a set of registers. In some implementations, the storage 108 can be a temporary storage. In some implementations, the storage 108 can be implemented as a portion of the memory cell array 104, which can be distinct from the memory cells that are to be programmed.

Figure 2:
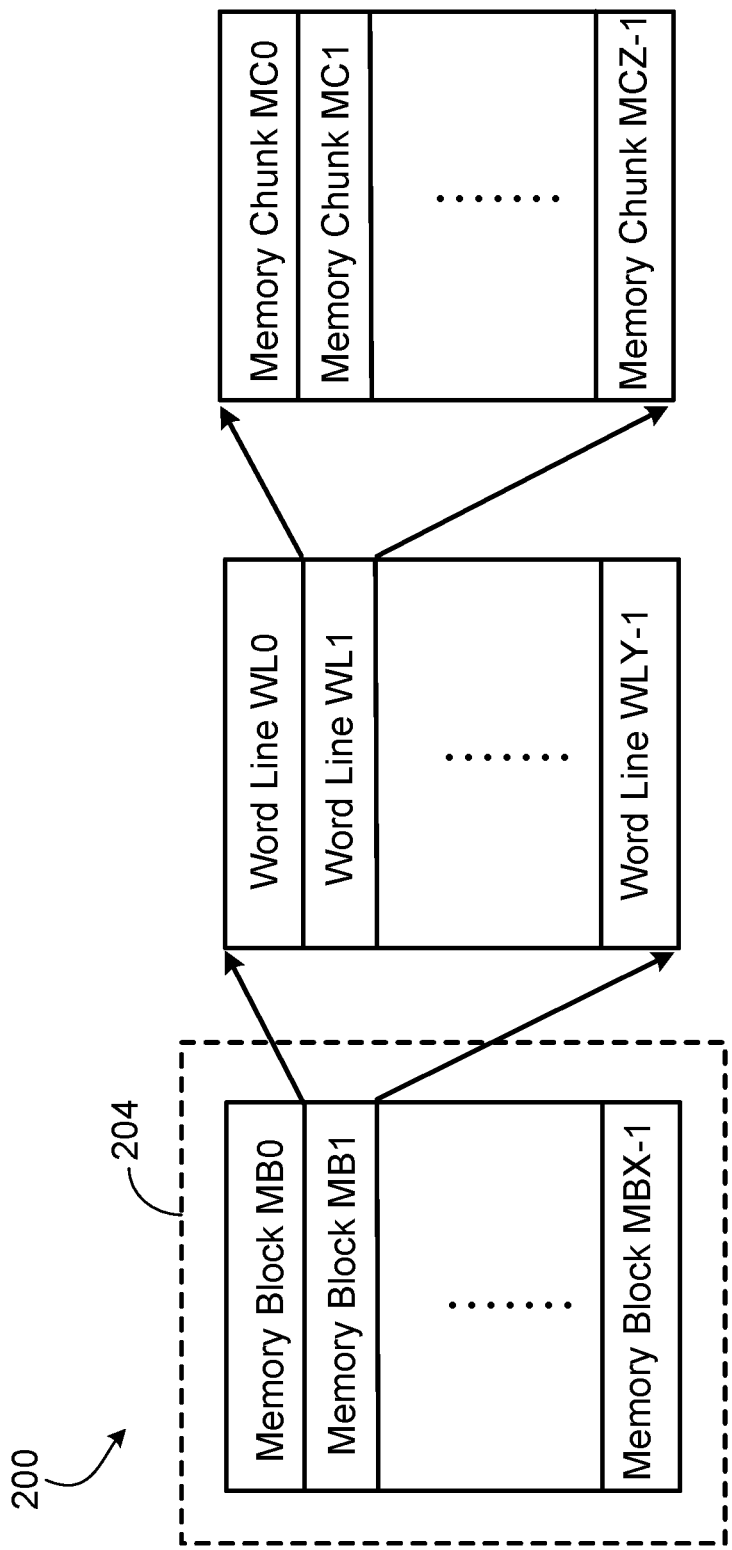
FIG. 2 illustrates an example hierarchy of a memory cell array in a memory device.

FIG. 2 illustrates an example hierarchy of a memory cell array 204 in a memory device 200. For example, the memory cell array 204 can be the memory cell array in FIG. 1 and the memory device 200 can be the memory device 100 in FIG. 1. For convenience, FIG. 2 is illustrated such that the memory device 200 includes only the memory cell array 204. However, like the memory device 100 in FIG. 2, the memory device 200 can include any suitable elements such as a memory controller and a storage as described with reference to FIG. 1.

The memory cell array 204 includes a plurality of memory blocks. For example, the memory cell array 204 can include a particular number of memory blocks MB0-MBX-1 (e.g., X={2, 3, 4, ... }). A memory controller of the memory device 200 can program data to one or more memory cells in the memory blocks MB0-MBX-1. In some implementations, the memory blocks MB0-MBX-1 can have the same structure. In some implementations, some memory blocks of the memory blocks MB0-MBX-1 can have the same structure and other memory blocks of the memory blocks MB0-MBX-1 can have a different structure.

Each memory block of the memory blocks MB0-MBX includes a plurality of word lines. For example, the memory block MB1 can include word lines WL0-WLY-1 (e.g., Y={2, 3, 4, ... }). In some implementations, other memory blocks of the memory blocks MB0-MBX-1 can also include the same number of word lines. In some implementations, other memory blocks of the memory blocks MB0-MBX-1 can include a different number of word lines. For example, where the memory block MB1 includes 128 word lines, the memory block MB0 can include 64 word lines.

Each word line of the word lines WL0-WLY-1 includes a plurality of memory chunks. For example, the word line WL1 can include memory chunks MC0-MHZ-1 (e.g., Z={2, 3, 4, ... }). In some implementations, other word lines of the word lines WL0-WLY-1 can also include the same number of word lines. For example, each of the word lines WL0-WLY-1 can include 128 memory chunks. In some implementations, other word lines of the word lines WL0-WLY-1 can include a different number of word lines. For example, where the word line WL1 includes 128 memory chunks, the word line WL0 can include 64 memory chunks.

Figure 3A:
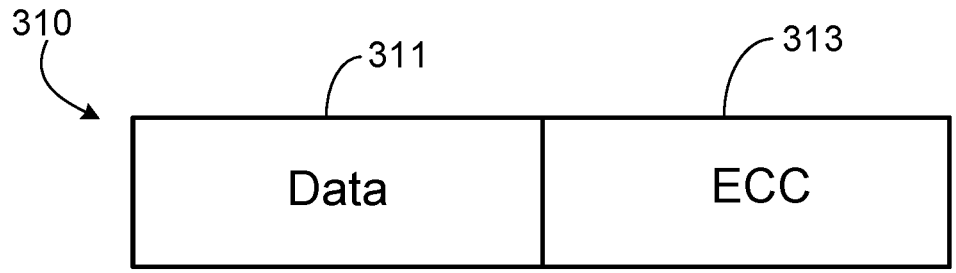
FIGS. 3A to 3C illustrate example memory chunks of a memory device.
Figure 3B:
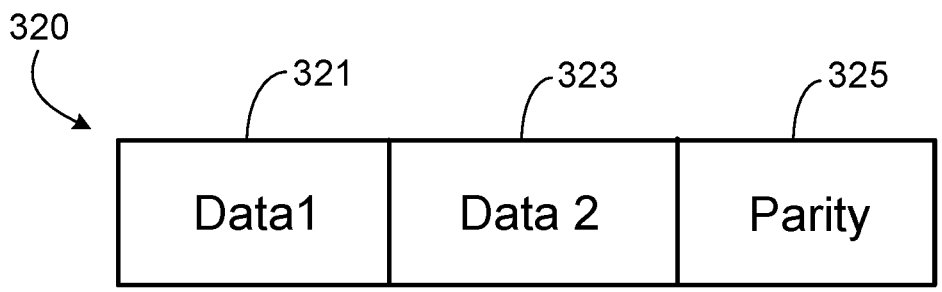
Figure 3C:
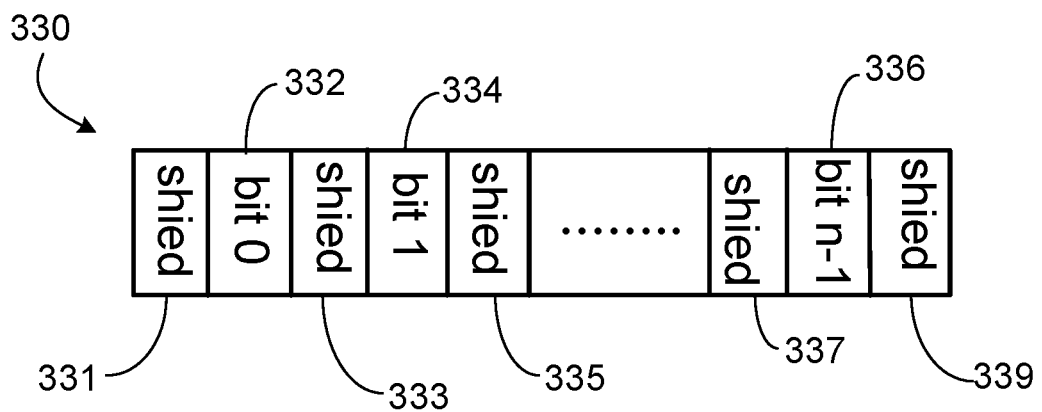

FIGS. 3A to 3C illustrate example memory chunks of a memory device. The memory chunk includes a plurality of memory cells. In some implementations, a memory chunk can include a group of memory cells that are used to store data. In some implementations, a memory chunk can include multiple groups of memory cells that are respectively used to store data, used for a redundancy. In some implementations, a memory chunk can further include one or more shielding areas to protect memory cells that are used to store data.

FIG. 3A illustrate a first example of a memory chunk. For example, the memory chunk 310 in FIG. 3A can be one memory chunk of the memory chunks MC0-MCZ-1 in FIG. 2. In this example, the memory chunk 310 includes a first group of memory cells 311 that are used to store data and a second group of memory cells 313 that are used for a redundancy, e.g., an error-correction code (ECC). That is, a memory controller can program data to the first group of memory cells 311 and store an ECC that is used for detecting or correcting internal data corruption in the second group of memory cells 313. In some implementations, the first group of memory cells 311 or the second group of memory cells 313 can include a single memory cell.

FIG. 3B illustrate a second example of a memory chunk. For example, the memory chunk 320 in FIG. 3B can be one memory chunk of the memory chunks MC0-MCZ-1 in FIG. 2. In this example, the memory chunk 320 includes a first group of memory cells 321 that are used to store first data, a second group of memory cells 323 that are used to store second data, and a third group of memory cells 325 that are used for a redundancy, e.g., a parity. Since the memory chunk 320 includes two groups of memory cells 321 and 323, a memory controller can program different data, e.g., Data 1 or Data 2, to the first group of memory cells 321 or the second group of memory cells 323, respectively. In addition, the memory controller can use the third group of memory cells 325 as a parity. Where the memory controller fails to program data to the first group of memory cells 321 or the second group of memory cells 323, the memory controller can use data stored in the third group of memory cells 325 to create a replacement storage area. In some implementations, the first group of memory cells 321, the second group of memory cells 323, or the third group of memory cells 325 can include a single memory cell.

FIG. 3C illustrate a third example of a memory chunk. For example, the memory chunk 330 in FIG. 3C can be one memory chunk of the memory chunks MC0-MCZ-1 in FIG. 2. In this example, the memory chunk 330 includes a plurality of memory cells 332, 334, and 336 that are respectively used to store data, e.g., one-bit data, and a plurality of shielding areas 331, 333, 335, 337, and 339. Each memory cell of the memory cells is shielded by respective shielding areas. For example, the memory cell 332 is shielded by the shielding areas 331 and 333, the memory cell 334 is shielded by the shielding areas 333 and 335, and the memory cell 336 is shielded by the shielding areas 337 and 339. In some implementations, memory cells in a memory chunk, e.g., memory cells 332, 334, and 336, are respectively coupled to bit lines. With reference to FIG. 3C, the memory chunk 330 includes n (n=2, 3, 4, . . . ) memory cells that are respectively coupled to n bit lines. For example, for n=8, the memory chunk 330 includes 8 memory cells that are respectively coupled to 8 bit lines. In some implementations, the number of memory cells in a memory chunk is same as the number of word lines in a memory block. In such cases, where one memory block includes 8 word lines, for example, a memory chunk in the memory block includes 8 memory cells that are respectively coupled to 8 bit lines.

In some implementations, when the memory controller programs the memory chunk 330, the memory controller programs only one memory cell in the memory chunk 330 during one programming cycle. For example, the memory controller may program only the memory cell 332 in one programming cycle and another memory cell 334 in a different programming cycle. By programming one memory cell in one programming cycle, an error that can occur between adjacent bit lines that are coupled to the same memory chunk can be prevented.

The shielding areas 331, 333, 335, 337, and 339 can protect the data programmed in the memory cells 332, 334, and 336 when a memory controller performs reading operations or programming operations to memory cells other than the memory cells 332, 334, and 336. Although FIG. 3C illustrates that one memory cell is shielded by shielding areas, the number of memory cells shielded by shielding areas is not limited to a particular number. In some implementations, multiple memory cells can be shielded by shielding areas. For example, instead of the memory cell 332, two or more memory cells can be shielded by the shielding areas 331 and 333.

Figure 4A:
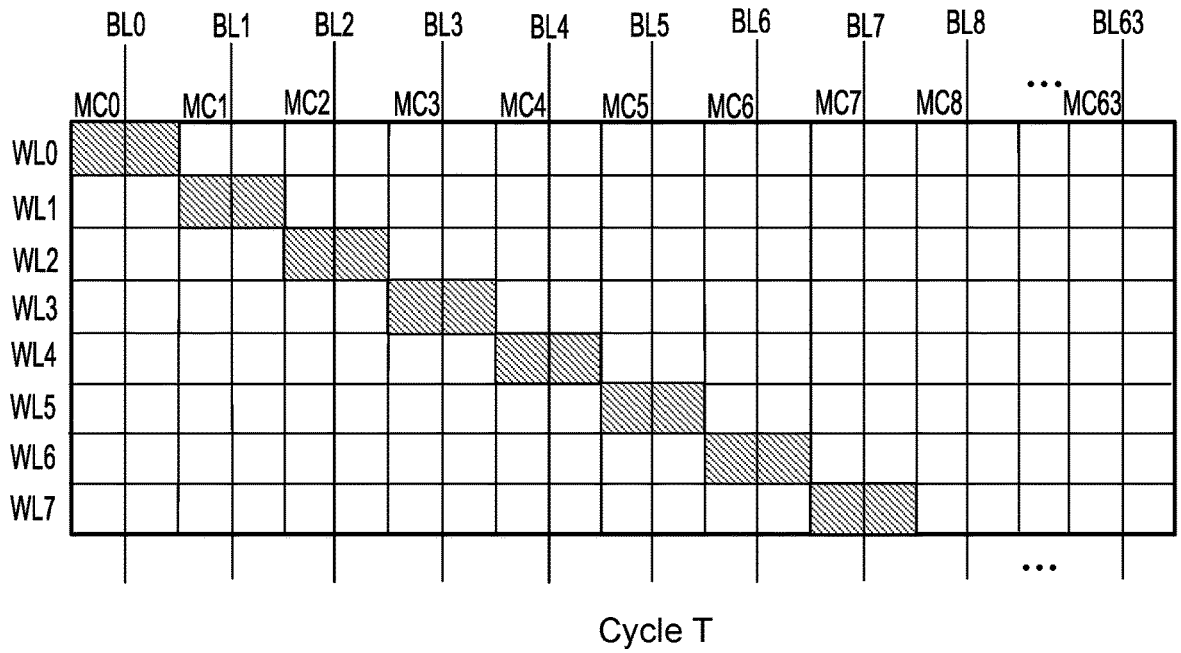
FIGS. 4A and 4B illustrate example timing diagrams to perform programming operations to memory chunks of a word line.
Figure 4A:
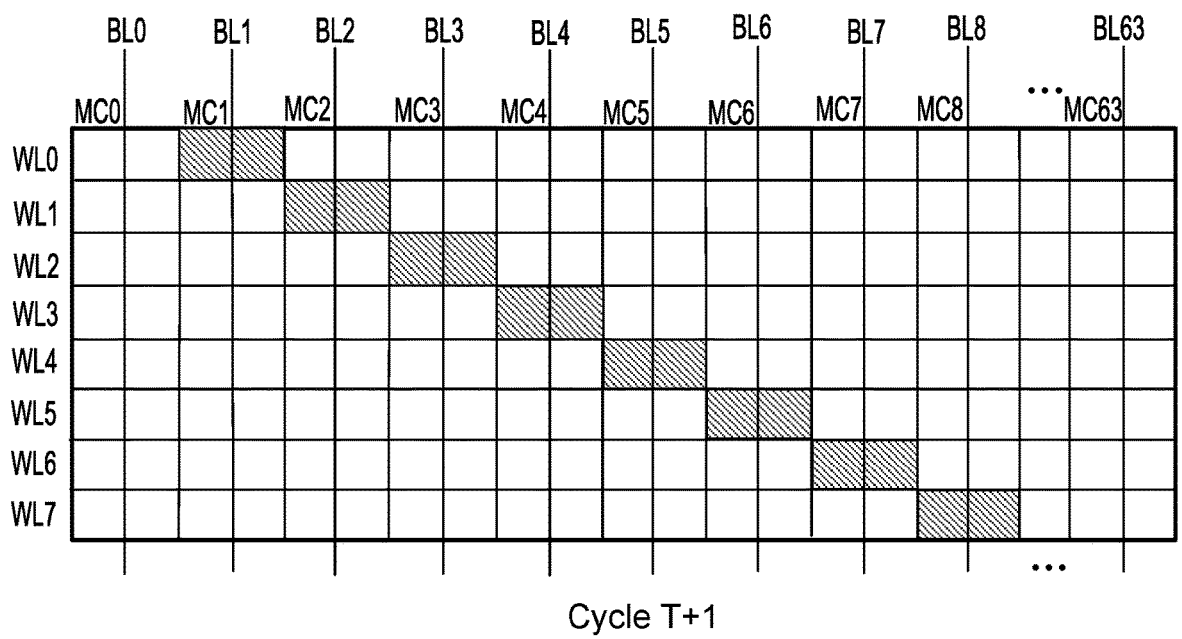
Figure 4B:
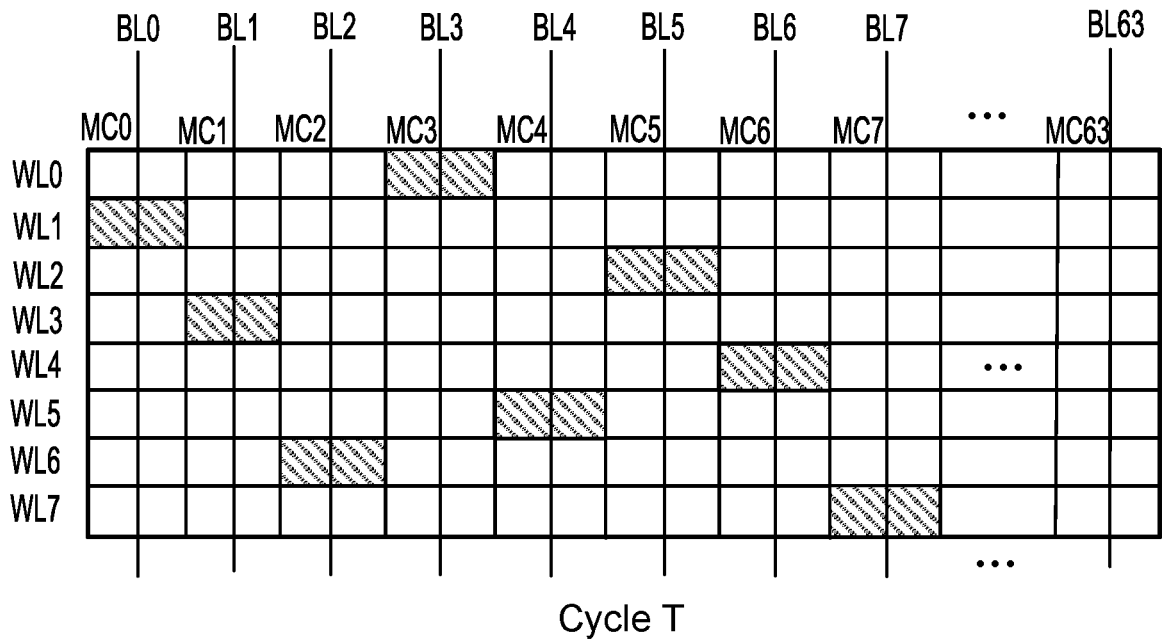
Figure 4B:
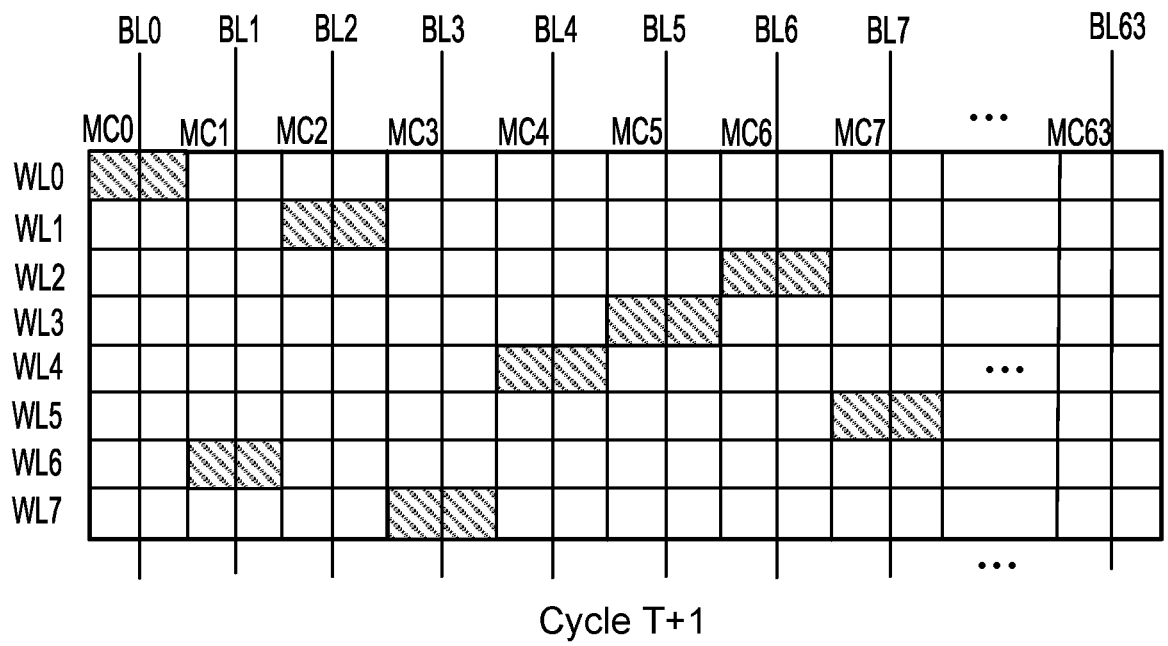

FIGS. 4A and 4B illustrate example timing diagrams to perform programming operations to memory chunks in a word line. For example, the memory block MB illustrated in FIGS. 4A and 4B can be the memory block MB1 illustrated in FIG. 2. For convenience, the memory block MB in FIGS. 4A and 4B is illustrated to include 8 word lines and 64 memory chunks. However, the numbers of word lines and memory chunks are not limited to particular numbers and can be any suitable numbers. In this example, the memory block MB includes a plurality of word lines WL0-WL7. Each word line of the word lines WL0-WL7 includes a plurality of memory chunks MC0-MCM63. The memory chunks MC0 in the word lines WL0-WL7 are coupled to a bit line BL0, the memory chunks MC1 in the word lines WL0-WL7 are coupled to a bit line BL1, the memory chunks MC2 in the word lines WL0-WL7 are coupled to a bit line BL2, the memory chunks MC3 in the word lines WL0-WL7 are coupled to a bit line BL3, the memory chunks MC4 in the word lines WL0-WL7 are coupled to a bit line BL4, the memory chunks MC5 in the word lines WL0-WL7 are coupled to a bit line BL5, the memory chunks MC6 in the word lines WL0-WL7 are coupled to a bit line BL6, the memory chunks MC7 in the word lines WL0-WL7 are coupled to a bit line BL7, . . . , and the memory chunks MC63 in the word lines WL0-WL7 are coupled to a bit line BL63. Although the memory chunks are described as coupled to one bit line, the number of bit lines that are coupled to a memory chunk is not limited to one. Any suitable number of bit lines can be coupled to a memory chunk. For example, 8 bit lines can be coupled to the memory chunk MC0.

FIG. 4A illustrates first example timing diagrams to perform programming operations to memory chunks in a word line. In this example, a memory controller, e.g., the memory controller 102 in FIG. 1, can program data to memory chunks in a particular order, e.g., using a sequential order, in which adjacent memory chunks in a word line are programmed in successive cycles.

When the memory controller programs data to memory chunks in the memory block MB, the memory controller programs data to a single memory chunk in one bit line during one cycle such that a disturbance is not spread through the bit line. For example, during a cycle T, the memory controller can simultaneously program data to the memory chunk MC0 in the word line WL0, the memory chunk MC1 in the word line WL1, the memory chunk MC2 in the word line WL2, the memory chunk MC3 in the word line WL3, the memory chunk MC4 in the word line WL4, the memory chunk MC5 in the word line WL5, the memory chunk MC6 in the word line WL6, and the memory chunk MC7 in the word line WL7.

During the next cycle T+1, the memory controller programs memory chunks sequentially, e.g., program data to memory chunks that are immediately adjacent to the memory chunks programmed during the cycle T. For example, during the cycle T+1, the memory controller can program data to the memory chunk MC1 in the word line WL0, the memory chunk MC2 in the word line WL1, the memory chunk MC3 in the word line WL2, the memory chunk MC4 in the word line WL3, the memory chunk MC5 in the word line WL4, the memory chunk MC6 in the word line WL5, the memory chunk MC7 in the word line WL6, and the memory chunk MC8 in the word line WL7. In some implementations, a different order to program data to memory chunks can be used. In some implementations, the memory controller can program all the memory chunks in word lines during multiple cycles. For example, the memory controller can program data to 64 memory chunks in word lines during 64 cycles.

FIG. 4B illustrates second example timing diagrams to perform programming operations to memory chunks in a word line. In this example, a memory controller, e.g., the memory controller 102 in FIG. 1, can program data to memory chunks in each word line in a random order. In some implementations, although the programming operations is performed in a random order, the memory controller does not program a memory chunk that has been programmed during one of the previous programming cycles.

When the memory controller programs data to memory chunks in the memory block, the memory controller programs data to a single memory chunk in one bit line during one cycle such that a disturbance is not spread through the bit line. For example, during a cycle T, the memory controller can program data to the memory chunk MC3 in the word line WL0, the memory chunk MC0 in the word line WL1, the memory chunk MC5 in the word line WL2, the memory chunk MC1 in the word line WL3, the memory chunk MC6 in the word line WL4, the memory chunk MC4 in the word line WL5, the memory chunk MC2 in the word line WL6, the memory chunk MC7 in the word line WL7.

During the next cycle T+1, the memory controller can program data to memory chunks that are not programmed during the cycle T. In addition, the memory controller programs data to a single memory chunk in one bit line during one cycle. For example, during the cycle T+1, the memory controller can program data to the memory chunk MC0 in the word line WL0, the memory chunk MC2 in the word line WL1, the memory chunk MC6 in the word line WL2, the memory chunk MC5 in the word line WL3, the memory chunk MC4 in the word line WL4, the memory chunk MC7 in the word line WL5, the memory chunk MC1 in the word line WL6, the memory chunk MC3 in the word line WL7. In some implementations, the memory controller can program all the memory chunks in word lines during multiple cycles. For example, the memory controller can program data to 64 memory chunks in word lines during 64 cycles.

Figure 5A:
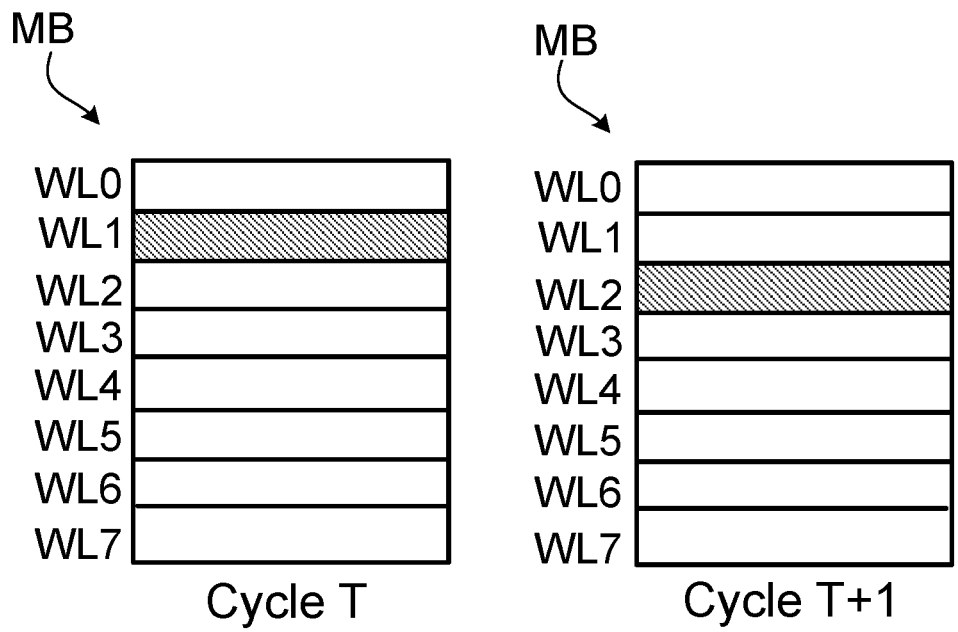
FIGS. 5A and 5B illustrate example timing diagrams to perform programming operations to word lines of a memory block.
Figure 5B:
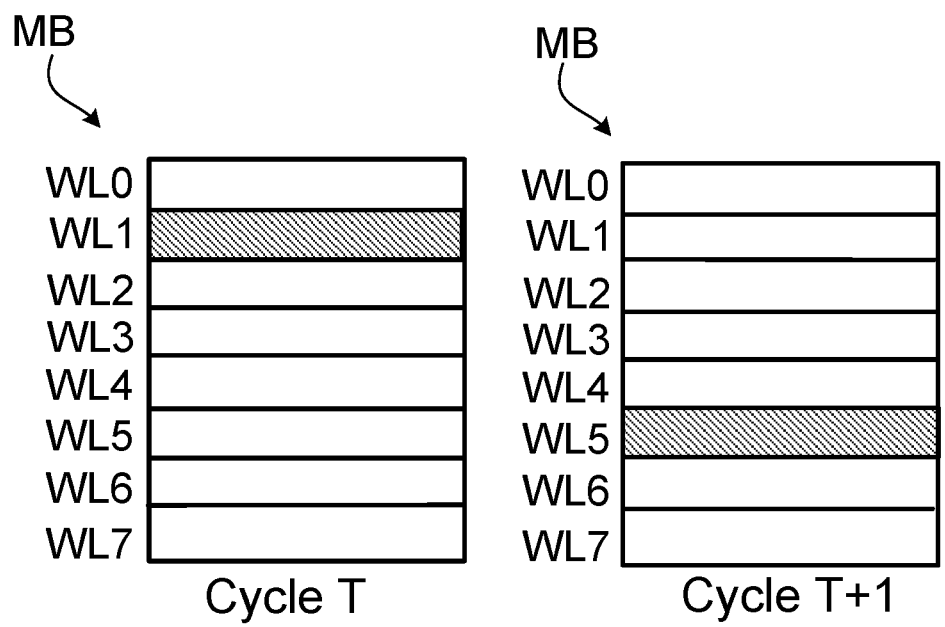

FIGS. 5A and 5B illustrate example timing diagrams to perform programming operations to word lines of a memory block. For example, the memory block MB illustrated in FIGS. 4A and 4B can be the memory block MB1 illustrated in FIG. 2. For convenience, the memory block MB in FIGS. 4A and 4B is illustrated to include 8 word lines. However, the number of word lines is not limited to a particular number and can be any suitable number.

FIG. 5A illustrates a first example timing diagram to perform programming operations to word lines in a memory block MB. The memory block MB includes a plurality of word lines WL0-WL7. In this example, a memory controller, e.g., the memory controller 102 in FIG. 1, selects word lines to program memory chunks of the word line in a particular order, e.g. a sequential order of the word lines.

As shown in FIG. 5A, during a cycle T, the memory controller selects the word line WL1 to program data to one or more memory chunks in the word line WL1. During the next cycle T+1, the memory controller selects a word line sequentially, e.g., the word line WL2 that is next to the word line WL1, to program data to memory chunks in the word line WL2.

However, in some implementations, a different order to select a word line is used. For example, the memory controller can select the word line WL1 during the cycle T, the word line WL3 during the cycle T+1, and the word line WL5 during a cycle T+2. In some implementations, the memory controller is configured to select all word lines within a set number of cycles. For example, each cycle the memory controller can select a previously unselected word line until all of the word lines have been selected. At this point, the process can reset. For example, the memory controller can select 8 word lines during 8 cycles.

In some implementations, as described below with reference to FIG. 5B, a memory controller, e.g., the memory controller 102 in FIG. 1, selects word lines in a random order to program memory chunks. In such cases, although the programming operations is performed in a random order, the memory controller does not program a word line that has been programmed during one of the previous programming cycles.

As shown in FIG. 5B, during a cycle T, the memory controller selects a word line WL1 to program data to one or more memory chunks in the word line WL1. During the next cycle T+1, the memory controller selects another word line in a random order, e.g., the word line WL5, that is not selected during the cycle T, to program data to memory chunks in the word line WL5. During the cycle T+2, the memory controller can randomly select yet another word line, e.g., the word line WL3, that is not selected during the previous cycles T and T+1, to program data to memory chunks in the word line WL3. In some implementations, the memory controller is configured to select all word lines within a set number of cycles. For example, in each cycle the memory controller can select a previously unselected word line until all of the word lines have been selected. At this point, the process can reset. For example, the memory controller can select 8 word lines during 8 cycles.

Figure 6:
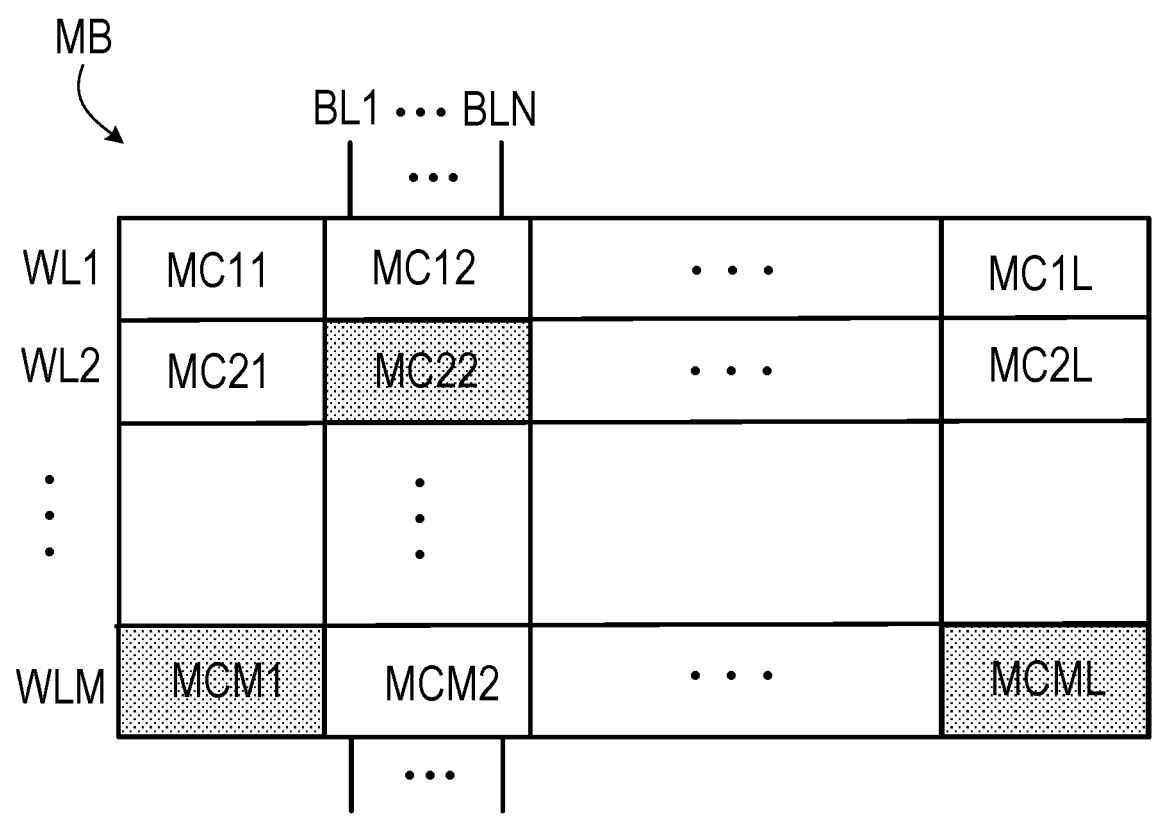
FIG. 6 illustrates an example diagram of one-shot programming operations for a particular memory chunk in a memory block.

FIG. 6 illustrates an example diagram of one-shot programming operations for a particular memory chunk in a memory block. For example, the memory block MB in FIG. 6 can be the memory block MB1 illustrated in FIG. 2. The memory block MB includes a plurality of word lines WL1, WL2, . . . , WLM (M=2, 3, 4, . . . ). Each of these word lines includes a plurality of memory chunks. For example, the word line WL2 includes L (L=2, 3, 4, . . . ) memory chunks MC21, MC22, . . . MC2L. In some implementations, a memory chunk is coupled to a particular number of bit lines. For example, each of the memory chunks MC12, MC22, . . . MCM2 can be coupled to N (N=2, 3, 4, . . . ) bit lines BL1-BLN. In some implementations, each memory chunk of the memory chunks MC21, MC22, . . . MC2L are coupled to the same number of bit lines. In other implementations, different memory chunks of the memory chunks MC21, MC22, . . . M2L are coupled to different numbers of bit lines.

In this example, an error detection circuit, e.g., the error detection circuit 106 in FIG. 1, detects an error rate of the memory block MB and reports the error rate to a memory controller, e.g., the memory controller 102 in FIG. 1. In some implementations, rather than reporting a counted number of errors, the error detection circuit 106 can report an error rate, e.g., a number of errors per unit time, for a memory block. The memory controller determines a status of the memory block MB based on the error rate of the memory block MB, e.g., the controller 102 can compare the error rate to a threshold error rate to determine the status of the memory block.

Once the memory controller determines the status of the memory block MB, the memory controller can determine which programming operations the memory controller will perform to program data to the memory block MB. For example, where the status of the memory block MB is wear-out or bad, the memory controller can determine to perform a one-shot programming operation to program data to the memory block. In other cases, where the status of the memory block MB is good, the memory controller can determine to perform multi-level programming operations to program data to the memory block MB. In some implementations, even where the status of the memory block MB is good, the memory controller can determine to perform the one-shot programming operation to program data to the memory block MB if the memory device requires high reliability. In some implementations, the one-shot programming operation is also referred to as chunk operation, in which a particular memory chunk, out of several memory chunks that are coupled to a word line, is programmed in a programming cycle, by applying a program voltage to the memory block that includes the particular memory chunk.

In case the memory controller determines that a chunk operation or one-shot programming operation is to be performed, the memory controller selects a particular word line in the memory block MB using the methods described with reference to FIGS. 5A and 5B, and selects a particular memory chunk in the selected word line using the methods described with reference to FIGS. 4A and 4B. For example, in some implementations, the memory controller selects individual word lines in a sequential order of selecting the word lines, as described with reference to FIG. 5A. In other implementations, the memory controller selects individual word lines in a random order of selecting the word lines, as described with reference to FIG. 5B. In either case, the memory controller programs, in some implementations, memory chunks corresponding to the selected word line in sequential order in successive programming cycles, e.g., as described with reference to FIG. 4A. However, in other implementations, the memory controller programs memory chunks corresponding to the selected word line in a random order in successive programming cycles, e.g., as described with reference to FIG. 4B.

In some implementations, in the one-shot programming operation, the memory controller performs programming operations to a single memory chunk from a group of memory chunks that are coupled to a group of bit lines in one cycle. For example, as shown in FIG. 6, multiple memory chunks MC12, MC22, ... MCM2 are coupled to a group of bit lines BL1, ..., BLN. In this example, in performing the chunk operation, the memory controller programs data to only one of the memory chunks MC12, MC22, MCM2 that are coupled to the bit lines BL1, ..., BLN, in a particular programming cycle. By programming a single memory chunk during one cycle, the disturbance that can occur between multiple memory chunks that are coupled to the same bit lines can be significantly reduced or eliminated. This improves the reliability of the memory device.

In some implementations, the memory controller performs chunk operations based on particular rules. For example, the memory controller can perform chunk operations based on the following rules.

$$0 \leq X_M \leq M \qquad \text{Rule 1:}$$

$$X_1 + X_2 + \ldots + X_M \leq M \qquad \text{Rule 2:}$$

$X_M$ indicates the number of programmed memory chunks for a particular word line WLM (M=1, 2, 3, ...). For example, $X_1$ indicates the number of programmed memory chunks for the word line WL1 and $X_2$ indicates the number of programmed memory chunks for the word line WL2. To verify that programming operations have been performed correctly, the memory controller counts the number of programmed memory chunks for each word line. For example, as shown in FIG. 6, for the word line WL1, no memory chunk has been programmed among memory chunks MC11-MC1L. For the word line WL2, the memory chunk MC22 has been programmed among memory chunks MC21-MC2L. For the word line WLM, the memory chunks MCM1 and MCML have been programmed among memory chunks MCM1-MCML. Based on the counting, the memory controller determines that $X_1$ is 0, $X_2$ is 1, and $X_M$ is 2. Assuming M=192, the memory controller determines that $X_1$, $X_2$, and $X_{192}$ satisfy Rule 1 and $X_1 + X_2 + \ldots + X_{192}$ satisfy Rule 2. As a result, the memory controller can verify that the memory chunks have been correctly programmed based on the rules.

Figure 7A:
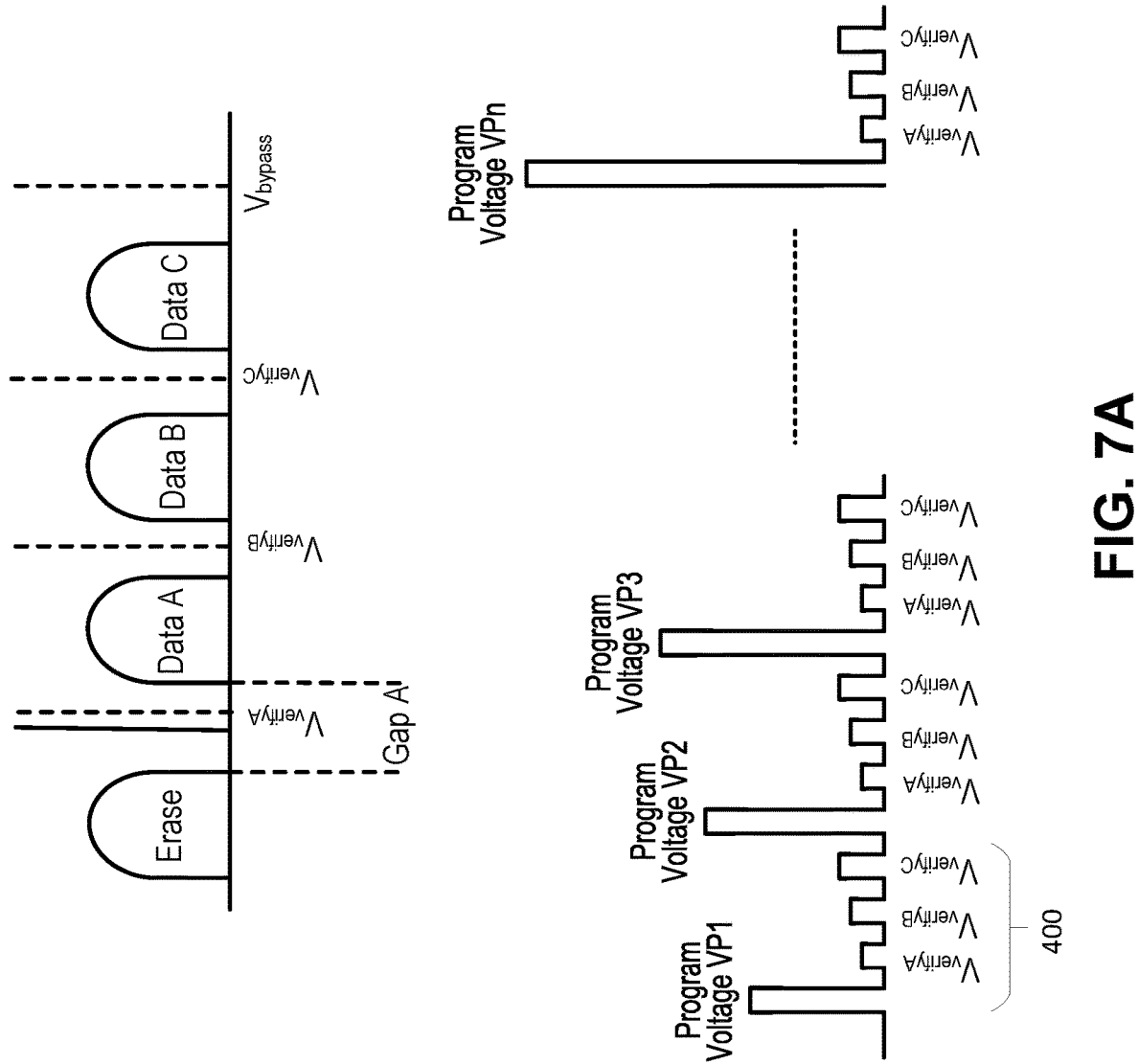
FIGS. 7A and 7B illustrate example diagrams to perform programming operations to a particular memory block.
Figure 7B:
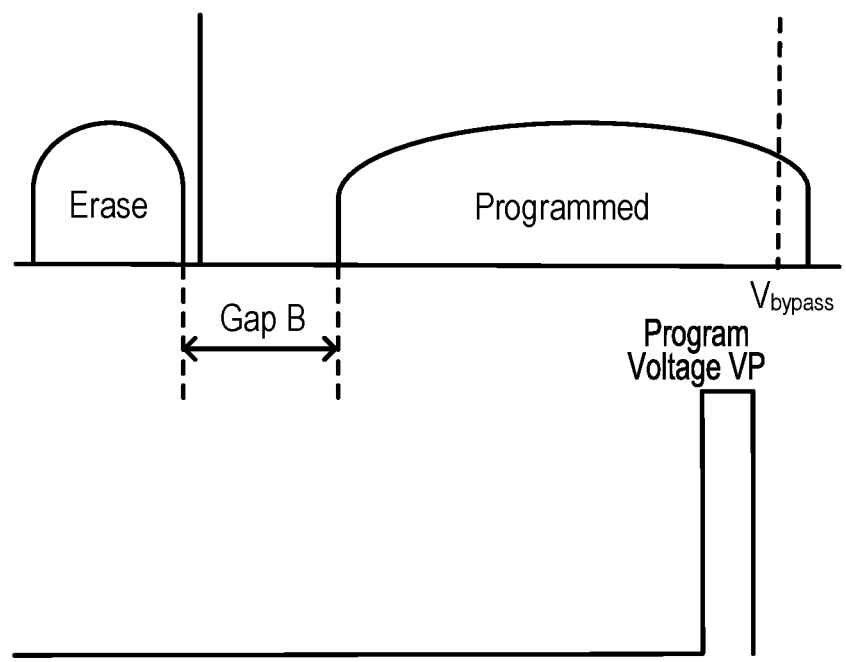

FIGS. 7A and 7B illustrate example diagrams to perform programming operations to a particular memory block. In these examples, a memory controller, e.g., the memory controller 102 in FIG. 1, can perform programming operations to program data to a memory block, e.g., the memory block MB in FIG. 6.

FIG. 7A illustrates an example diagram to perform multi-level programming operations during one programming cycle. The programming cycle includes a plurality of stages 400. In each stage, the memory controller provides a program voltage pulse, followed by a series of verify voltage pulse. The number of stages 400 can be equal to the number of data states to which the memory cells can be programmed (or one less than the total number of states, including the erase state). For example, if a cell can be programmed as Data A, Data B, or Data C, there can be three stages.

If the memory controller is programming a target word line, it applies the program voltage pulse to the target word line. For example, the memory controller can apply a program voltage VP1 in the first stage, a program voltage VP2 in the second stage, etc. The program voltage for each consecutive stage can be larger than the program voltage for the prior stage.

If a cell in the target word line needs remain in its present state (either erased or in a given Data state), the memory controller will apply an "on" or "high" voltage, e.g., the Vcc voltage, to the bit line for the cell. This will inhibit the cell from being programmed. Otherwise, e.g., if a cell in the target word line is to be programmed, the memory controller will apply ground on the bit line for the cell. This will program the selected cell.

Within each stage, after applying the program voltage pulse, the memory controller applies a sequence of verify voltage pulses. The number of verify voltage pulses can be equal to the number of data states (or one less than the total number of states including the erase state) to which the memory cells of can be set. For example, if there are four states (Data A, Data B, Data C and Erase), then the memory controller can apply a sequence of three verify voltage pulses with verify voltages $V_{verifyA}$, $V_{verifyB}$ and $V_{verifyC}$, respectively. The verify voltage for each verify voltage pulse in the sequence can be larger than the verify voltage for the prior verify voltage pulse. Each verify voltage can be associated with a respective data state. For example, verify voltages $V_{verifyA}$, $V_{verifyB}$ and $V_{verifyC}$ can be associated with Data A, Data B, Data C, respectively.

Using the verify voltage pulses, the memory controller can confirm whether the threshold voltage of a given cell has reached that verify voltage or not. If the voltage threshold of the cell has reached the verify voltage associated with the desired data for the cell, then the cell should not be programmed in the next stage. On the other hand, if the voltage threshold of the cell has not reached the verify voltage associated with the desired data for the cell, then the cell should be programmed in the next stage.

For example, if the memory controller is to program a cell to have Data B, then after each programming pulse, the memory controller can determine whether the threshold voltage of the cell has reached the $V_{verifyB}$. If the threshold voltage of the cell has reached $V_{verifyB}$, then during the next stage the cell should not be programmed, so the memory controller should apply Vcc on the bit line. On the other hand, if the threshold voltage of the cell has not reached $V_{verifyB}$, then during the next stage the memory controller should apply ground on the bit line to program the cell.

FIG. 7B illustrates an example diagram to perform chunk or one-shot programming operations for one programming cycle. During the programming cycle, the memory controller provides a program voltage VP to program data to a particular memory chunk, e.g., the memory chunk MC1 in FIG. 6, of the memory block. In this example, since the memory controller programs data using the program voltage VP, e.g., a voltage that is higher than the program voltage VP1, the processes for erasing data are not necessary. While programming data using the program voltage VP, the data programmed in the memory chunk can be erased without additional erasing processes. In addition, since the memory controller programs data to a single memory chunk, multiple processes to program multi-level data, e.g., Data A, Data B and Data C, are not necessary. Thus, the memory controller can perform programming operations faster than is the case for multi-level programming operations. Moreover, the memory controller programs data to a single memory chunk such that the disturbance between two memory chunks cannot occur in the memory block. In some implementations, the program voltage VP is set to a value between 12 V (volts) and 26 V.

With reference to FIGS. 7A and 7B, the gap "Gap B" between the erase voltage level and the program voltage level is larger than the gap "Gap A" between the erase voltage level and the lowest program voltage level. Thus, the memory device programmed using the one-shot programming method in FIG. 7B has larger tolerance than the memory device programmed using the method in FIG. 7A, by reducing or eliminating read disturbance.

The disclosed and other examples can be implemented as one or more computer program products, for example, one or more modules of computer program operations encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Computer readable media suitable for storing computer program operations and data can include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device, comprising:
a memory cell array that includes a plurality of memory blocks, wherein each of the memory blocks includes a plurality of word lines, wherein at least one of the word lines is coupled to a plurality of memory chunks, and wherein a memory chunk of the plurality of memory chunks includes a group of memory cells; and
a memory controller that is configured to program data to a particular memory chunk of the plurality of memory chunks in a particular program cycle by performing a chunk operation that includes:
  selecting a particular word line from the plurality of word lines,
  selecting a particular memory chunk from the plurality of memory chunks that are coupled to the particular word line, wherein selecting the particular memory chunk comprises:
    identifying one or more memory chunks coupled to the particular word line that have not been programmed in the program cycle preceding the particular program cycle, and
    selecting one of the identified one or more memory chunks as the particular memory chunk, and
  applying a program voltage to a particular memory block corresponding to the particular memory chunk to program data to the particular memory chunk.

2. The memory device of claim 1, wherein the memory controller is configured to select the particular word line from the plurality of word lines sequentially.

3. The memory device of claim 1, wherein the memory controller is configured to select the particular memory chunk from the plurality of memory chunks sequentially.

4. The memory device of claim 1, wherein the memory controller is configured to select the particular word line from the plurality of word lines randomly.

5. The memory device of claim 1, wherein the memory controller is configured to select the particular memory chunk from the plurality of memory chunks randomly.

6. The memory device of claim 1, wherein the memory controller is configured to perform the chunk operation to the particular memory block by providing a program voltage that is between 12 V and 26 V.

7. The memory device of claim 1, further comprising:
an error detection circuit that is configured to detect one or more errors that occur in the particular memory block and generate an error rate,
wherein the memory controller is configured to perform the chunk operation upon the error rate satisfying a threshold value.

8. The memory device of claim 1, further comprising:
a plurality of bit lines, each of the bit lines being respectively coupled to one or more memory chunks of the plurality of memory chunks,
wherein the memory controller is configured to perform the chunk operation to a single memory chunk in a bit line of the bit lines during a single cycle of the chunk operation.

9. A method to program one or more memory cells of a memory device by a memory controller, the method comprising:
selecting, by the memory controller during a particular programming cycle, a particular word line from a plurality of word lines included in a particular memory block of a plurality of memory blocks in a memory cell array of the memory device, wherein a plurality of memory chunks is coupled to at least one of the word lines;
identifying, by the memory controller, one or more memory chunks coupled to the particular word line that have not been programmed in the program cycle preceding the particular program cycle;
selecting, by the memory controller, a particular memory chunk from the identified one or more memory chunks that are coupled to the particular word line; and
applying a program voltage to the particular memory block corresponding to the particular memory chunk to program data to the particular memory chunk.

10. The method of claim 9, wherein selecting the particular word line comprises selecting the particular word line from the plurality of word lines sequentially.

11. The method of claim 9, wherein selecting the particular memory chunk comprises selecting the particular memory chunk from the plurality of memory chunks sequentially.

12. The method of claim 9, wherein selecting the particular word line comprises selecting the particular word line from the plurality of word lines randomly.

13. The method of claim 9, wherein selecting the particular memory chunk comprises selecting the particular memory chunk from the plurality of memory chunks randomly.

14. The method of claim 9, wherein applying the program voltage comprises providing a program voltage between 12 V and 26 V.

15. The method of claim 9, further comprising:
detecting, using an error detection circuit in the memory device, one or more errors that occur in the particular memory block; and
in response to detecting the one or more errors, generating, by the error detection circuit, an error rate.

16. The method of claim 15, further comprising:
upon the error rate satisfying a threshold value, applying, by the memory controller, the program voltage to the particular memory block corresponding to the particular memory chunk to program data to the particular memory chunk.

17. The method of claim 9, wherein selecting a particular memory chunk comprises:
selecting a single memory chunk in a bit line of a plurality of bit lines in the memory device during the particular programming cycle, wherein each of the plurality of bit lines is coupled to one or more memory chunks of the plurality of memory chunks.

18. A memory device, comprising:
a memory cell array that includes a plurality of memory blocks associated with a plurality of word lines and a plurality of bit lines, wherein:
at least one of the word lines is coupled to a plurality of memory chunks,
at least one of the bit lines is coupled to a plurality of memory chunks, and
a memory chunk of the plurality of memory chunks includes a group of memory cells; and
a memory controller that is configured to program data to the plurality of memory blocks by performing chunk operations that include:
in a first program cycle:
for a first word line of the plurality of word lines, selecting a first memory chunk coupled to the first word line, the first memory chunk further coupled to a first bit line of the plurality of bit lines, wherein the first memory chunk is the sole memory chunk of a plurality of memory chunks coupled to the first bit line that is selected in the first program cycle, and
applying a program voltage to program data to the first memory chunk, and
in a second program cycle immediately following the first program cycle:
for the first word line, selecting a second memory chunk coupled to the first word line, the second memory chunk being immediately adjacent to the first memory chunk programmed in the first program cycle, the second memory chunk further coupled to a second bit line of the plurality of bit lines, wherein the second memory chunk is the sole memory chunk of a plurality of memory chunks coupled to the second bit line that is selected in the second program cycle, and
applying a program voltage to program data to the second memory chunk.

19. The memory device of claim 18, wherein the memory controller is configured to perform the chunk operations by providing a program voltage that is between 12 V and 26 V.

20. The memory device of claim 18, further comprising:
an error detection circuit that is configured to detect one or more errors that occur in the plurality of memory blocks and generate an error rate in response to detecting the one or more errors,
wherein the memory controller is configured to apply the program voltage to program data to the first memory chunk or the second memory chunk upon the error rate satisfying a threshold value.

* * * * *